US006617765B1

(12) United States Patent
Lagier et al.

(10) Patent No.: US 6,617,765 B1

(45) Date of Patent: Sep. 9, 2003

(54) UNDERWATER BROADBAND ACOUSTIC TRANSDUCER

(75) Inventors: Yves Lagier, Sophia Antipolis (FR); Vito Suppa, Roquefort les Pins (FR); Gérard Roux, Opio (FR); Gilles Lubrano, Mougins (FR)

(73) Assignee: Thales Underwater Systems S.A.S., Sophia Antipolis (FR)

( * ) Notice: Subject to any disclaimer, the term of this patent is extended or adjusted under 35 U.S.C. 154(b) by 0 days.

(21) Appl. No.: 10/110,130

(22) PCT Filed: Oct. 10, 2000

(86) PCT No.: PCT/FR00/02815

§ 371 (c)(1), (2), (4) Date: Apr. 9, 2002

(87) PCT Pub. No.: WO01/29820

PCT Pub. Date: Apr. 26, 2001

(30) Foreign Application Priority Data

Oct. 22, 1999 (FR) ........................................ 9913215

(51) Int. Cl.[7] ........................................ H01L 41/08

(52) U.S. Cl. ..................... 310/330; 310/322; 310/324

(58) Field of Search ............................ 310/324, 326, 310/327, 330, 337, 322, 344

(56) References Cited

U.S. PATENT DOCUMENTS 2,700,738 A * 1/1955 Havens ..................... 310/327
3,271,596 A * 9/1966 Brinkerhoff .......... 116/DIG. 18
3,311,761 A 3/1967 Schloss ..................... 310/324
3,757,888 A 9/1973 Lagier et al. ............ 181/0.5 A
4,068,209 A 1/1978 Lagier ......................... 340/10
4,279,025 A 7/1981 Suppa ........................... 367/3
4,295,211 A 10/1981 Suppa et al. ................... 367/4
4,380,440 A 4/1983 Suppa ......................... 441/30
4,482,835 A * 11/1984 Bar-Cohen et al. ......... 310/327
4,517,664 A * 5/1985 Berglund ..................... 367/163
4,611,372 A * 9/1986 Enjoji et al. ............... 29/25.35
4,883,143 A 11/1989 Lagier ........................ 181/286
4,926,397 A 5/1990 Robertson ................... 367/157
5,144,597 A 9/1992 Lagier et al. ............... 367/166
5,431,058 A 7/1995 Lagier et al. ................. 73/779
5,664,456 A * 9/1997 Eckert ........................ 310/324
5,795,203 A 8/1998 Suppa et al. .................... 441/1
6,046,962 A 4/2000 Suppa et al. ................ 367/172
6,275,448 B1 * 8/2001 Kittower et al. ............ 367/155
6,345,014 B1 2/2002 Edouard et al. ............ 367/165

FOREIGN PATENT DOCUMENTS

| | | | |
|---|---|---|---|
| DE | 34 41 684 | 5/1986 | ............ H04R/7/04 |
| FR | 2 496 379 | 6/1982 | ............ H04R/1/44 |
| JP | 60 000200 | 1/1985 | ........... H04R/17/00 |
| JP | 03 295547 | 4/1992 | |

* cited by examiner

*Primary Examiner*—Thomas M. Dougherty

(74) *Attorney, Agent, or Firm*—Oblon, Spivak, McClelland, Maier & Neustadt, P.C.

(57) ABSTRACT

An underwater acoustic transducer configured to emit a low-frequency broadband acoustic signal. The underwater acoustic transducer includes a cap in the form of a cylinder closed on one side and open on the other side. A piezoelectric plate operating in flexion is fixed on the base of the cylinder outside the cylinder. The inside cavity defined by the cylinder is open freely toward the outside medium in which the acoustic waves are to be emitted. For identical dimensions, the underwater acoustic transducer makes it possible to decrease a central frequency of emission and to increase bandwidth.

8 Claims, 3 Drawing Sheets

UNDERWATER BROADBAND ACOUSTIC TRANSDUCER

Figure 1:
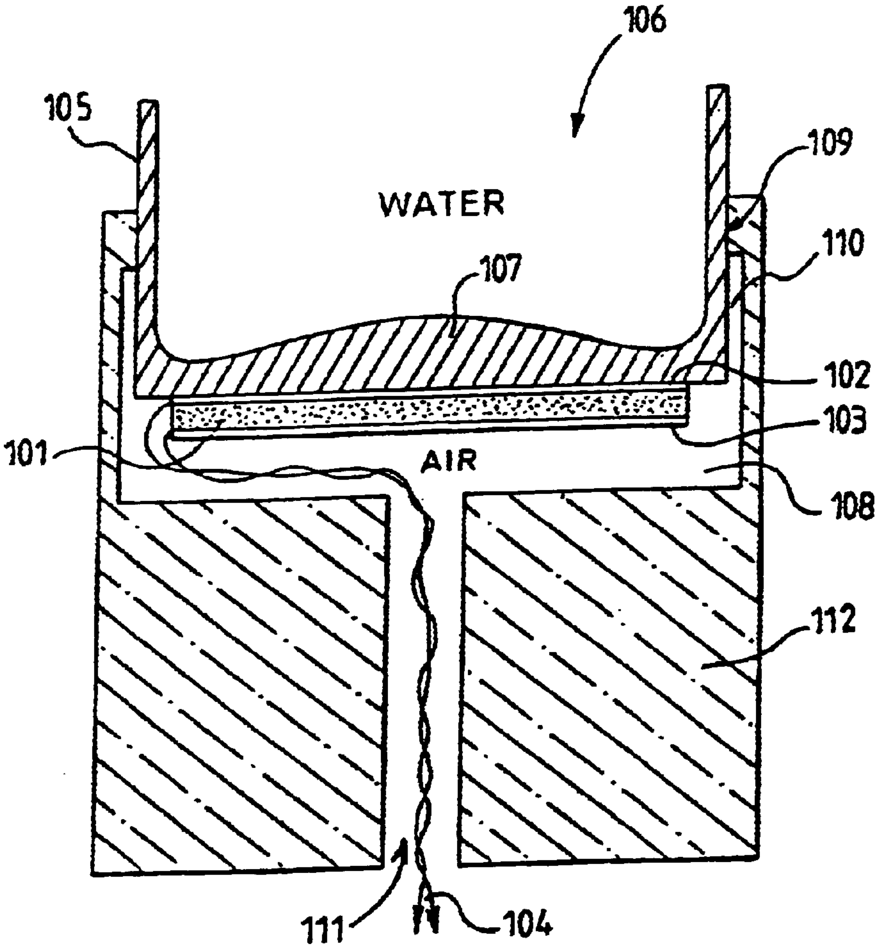

The present invention relates to broadband underwater acoustic transducers which are essentially used as acoustic signal emitters in the active sonars of surface vessels. However, these transducers may also be used as receivers, and also in sonars for submarines.

It is known that with progress in sonars, one seeks to decrease the working frequency, so as among other things to increase the range of these sonars, and the emission power. One also seeks to have transducers which operate in broadband so as to be able, through suitable processing, to circumvent the phenomena of reverberation, and to be able to use several sonars in one and the same geographical zone, thereby achieving interoperability of systems.

At present the most commonly used emitter transducers are of the so-called "tonpilz" type. These transducers use an emitter horn which is excited by a ceramic pillar which bears on a countermass.

These "tonpilz" emitters make it possible to obtain a good level of emission and considerable back rejection, allowing channel formation with a low level of secondaries. Furthermore, they are usable both for emission and for reception.

On the other hand they exhibit the disadvantage of having a relatively small bandwidth, typically corresponding to a quality factor $Q \cong 3.5$. Moreover the transducer/casing join is relatively fragile, giving rise to a risk of water ingress at this level. Finally, since the frequencies which can be emitted are strictly related to the dimensions of the horn, it is only possible to drop down in frequency by increasing these dimensions, this rapidly becoming prohibitive.

To alleviate these drawbacks, the invention proposes a broadband underwater acoustic transducer, comprising at least one piezoelectric plate operating in flexion, principally characterized in that it furthermore comprises a cylindrical cap closed at one end by a baseboard and open at the other end so as to form a first cavity; the piezoelectric plate being fixed on the outside face of the baseboard and the first cavity of the cap being open freely toward the outside medium in which the cap is immersed.

According to another characteristic, the cross section of the cap is circular.

According to another characteristic, the cross section of the cap is elliptical.

According to another characteristic, the first cavity is filled at least partially with a matching material whose acoustic characteristics are different from those of the outside medium in which the transducer is immersed.

According to another characteristic it furthermore comprises a body including a second inside cavity closed by the cap in such a way as to be insulated from the outside medium with the piezoelectric plate enclosed in the second inside cavity and the first cavity pointing outward.

According to another characteristic, it comprises two cap/piezoelectric plate assemblies fixed together head-to-tail.

According to another characteristic, the cap forms the front face of a transducer of the so-called "tonpilz" type.

Figure 2:
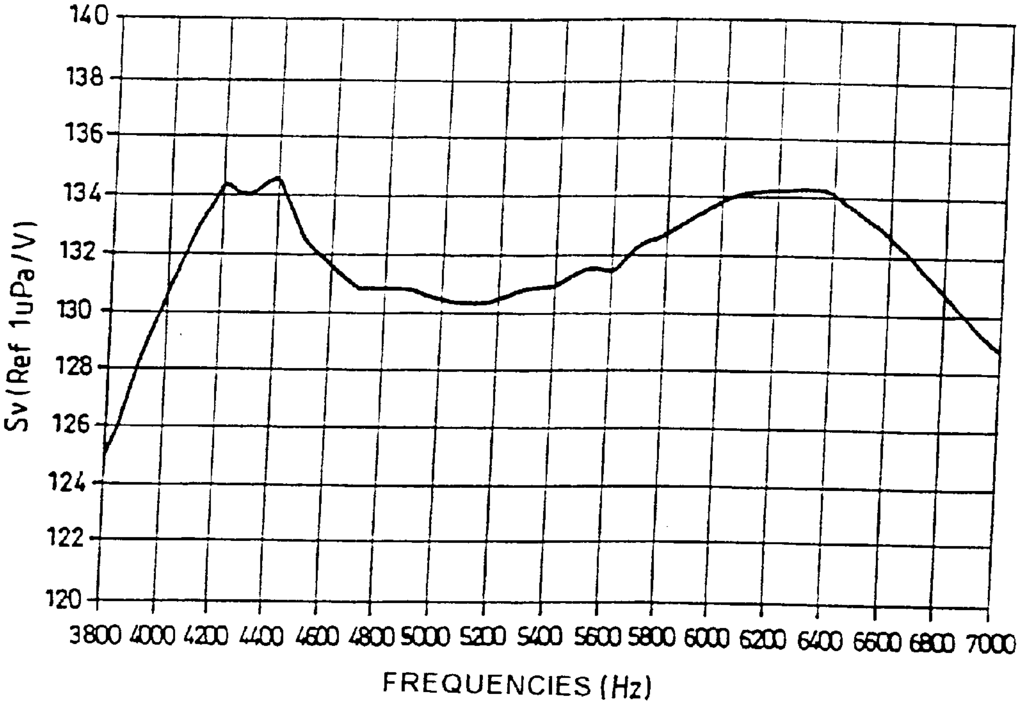
Figure 3:
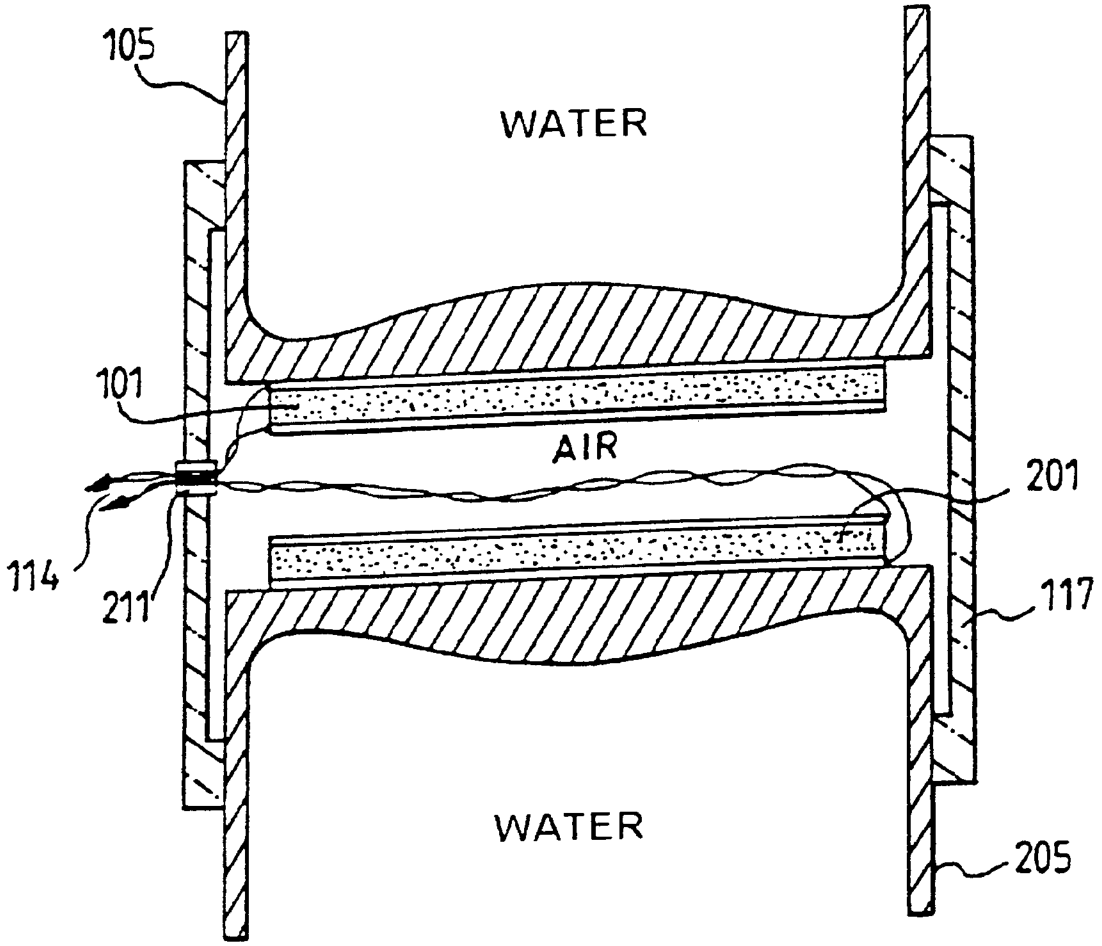

Other features and advantages of the invention will become clearly apparent in the following description, presented by way of nonlimiting example with regard to the appended figures which represent:

FIG. 1, a sectional view of a transducer according to the invention;

FIG. 2, a chart of frequency/amplitude of emission of such a transducer; and FIG. 3, a longitudinal sectional view of a variant of the invention, in which the transducer is dual.

The device according to the invention represented as a longitudinal section in FIG. 1 exhibits a structure which, as may readily be observed, is a complete break with the technology used currently, which relies on the above-cited "tonpilz" structure.

This device comprises as active element a ceramic board 101, preferably a single such board, and which in a conventional manner comprises a pair of electrodes 102 and 103 each fixed on one of the main faces of this board. Preferably these electrodes are constructed by silver plating. These electrodes are linked by wires 104 to an amplifier which delivers an excitation signal at the desired frequency. Given the structure of the apparatus, it would be entirely possible to limit these supply wires to a single wire linked to the electrode 103 which is insulated. The other electrode, which is linked to the earth of the apparatus, would then be supplied by way of this earth.

The electrode 102 is fixed on the lower plane face of a member 105 in the form of a cylinder closed at its base and open at its upper end. We shall refer to this member as a "cap".

The vibrations of the ceramic board 101 are transmitted to the cap, whose structure starts vibrating according to two main modes of resonance. The critical couplings of these two modes of resonance then make it possible to obtain a large bandwidth, corresponding to around 60% of the central frequency.

The first mode of resonance is the natural mode of flexion of the lower face of the cap under the action of the ceramic working in mode 3.1.

The second mode originates from the action of the fluid filling the inside cavity 106 formed by the cap which is immersed directly in the outside medium, seawater in general. Indeed in this cavity the speed of the acoustic waves is lower than in free space, since the walls of the cap are not infinitely rigid. A mode of resonance corresponding to a $\lambda/4$ plate is then obtained. The more the rigidity of the walls increases, the more the top frequency increases. The more the height of the walls increases, the more the bottom frequency decreases.

As represented in the figure, the invention also proposes that the lower wall 107 of the cap should exhibit a central thickening such that the cross section of this plate corresponds to the shape of a beam of equal strength. In this way, the constraints applied by the pressure of the outside fluid on the ceramic plate 101 by way of the bottom 107 of the cap are uniformly distributed over this plate, thereby preventing it from curving under the action of this pressure and hence thus eliminating the risks of breakage of the ceramic plate under the effect of the pressure.

This shape increases the area of radiation into the fluid by a factor of 2. In total one thus obtains better efficacy of the ceramic, better mechanoacoustic efficiency and a reduction in the cavitation threshold as compared with a standard flexion transducer.

In the embodiment represented in the figure, the transducer is supplemented with a body, or "tape", 107 which has the shape of a cylinder concentric with the cap 105 and which at its upper part exhibits a cavity 108 into which the cap will be engaged. This cap is fixed by its outside lateral face to the body by welding for example at the level of the upper end of this body. This fixing 109 is in the form of a thickening inside the cavity 108 in such a way as to leave a free space 110 between the internal wall of the cavity 108 and the external wall of the cap 105, so as to avoid disturbing the vibratory regime. The supply cables 104 exit the body via an axial channel 111 which emerges on one side in the cavity 108 and on another side on the lower surface of the body. This axial channel is plugged by means (not represented), a screw-type plug for example, which make it possible both to ensure the connection of the wires 104 and the hermetic sealing of the cavity 108/111. In this way, this cavity remains filled with air without the outside water penetrating into it, which allows the ceramic plate 101 to vibrate and would also short-circuit the electrodes 101.

According to an exemplary embodiment, represented in FIG. 2 is a curve of sensitivity to emission for such a transducer whose cap 105 exhibits an outside diameter of 115 millimeters with a thickness of the lateral walls of 4 millimeters, and a total height of 46 millimeters with a central thickness of the lower face of the cap equal to 14 millimeters. The broadening of the frequency band is clearly observable in this curve. Furthermore, this frequency band is shifted toward the low frequencies for a dimensioning which would corresponds for a conventional transducer of the "tonpilz" type to a markedly higher emission frequency.

By way of variant, the invention also proposes that the cap 105 be made in the shape of a cylinder with an elliptical rather than circular cross section. This then makes it possible to obtain two distinct resonances at the level of the cavity 106, in addition to the resonance of the ceramic plate 101. In this way the bandwidth is further increased.

It is also possible to use the cap 105/ceramic plate 101 assembly on its own, without appending the body 107 thereto, but while still ensuring the insulation of the electrodes 102 and 103 by an appropriate coating, a layer of waterproof paint for example. This transducer, which is then of the so-called "free flooded" type, can be used without any limit of submersion but however with a lower efficiency due to the action of the water on the back face of the ceramic. In this case the height of the cavity will advantageously be chosen to be equal to half the central wavelength of the transducer, so as to obtain good matching while performing a rephasing between the waves emitted forwards and those which in this case are emitted backwards.

The invention also proposes, by way of variant, that the cavity of the cap 105 be filled, possibly to a height which is not equal to that of the cap, with a matching material whose acoustic characteristics, in particular the speed of propagation of sound, are different from those of water. This makes it possible to modify the response curve, for example to make it flatter or to broaden it even more.

Another variant, represented in FIG. 3, consists in using two cap/ceramic assemblies, one 105/101 and the other 205/201, fixed head-to-tail on a cap 117 exhibiting the shape of a cylinder open on both sides. The connecting wires 114 to the two ceramic plates then exit via a connector 211 fixed on the lateral wall of the body 117. Such an arrangement makes it possible to obtain a transducer exhibiting a radiation of dipolar type, characterized by considerable rejection along its longitudinal axis.

Finally, an extension of the invention consists in contriving the emission horn of a known transducer of "tonpilz" type, in such a way that it takes the shape of the cap 105. A broadband "tonpilz" transducer is thus obtained which, by comparison with the basic embodiment of FIG. 1, makes it possible to obtain a greater emission power by virtue of the ceramic stack characteristic of a "tonpilz". However this advantage is achieved at the cost of an increase in bulkiness and a return to the known leakproofing problems of the "tonpilz" system since it is then necessary to maintain the freedom of clearance of the horn of the "tonpilz" with respect to the body of the latter.

To summarize, the invention makes it possible, relative to the technology currently used, to simultaneously obtain a broadening of the frequency band emitted, a shifting of this band toward the low frequencies without modifying the bulkiness of the device, an improvement in the watertightness of the front face, and a reduction in the cost of the apparatus by decreasing the number of members used for its manufacture.

What is claimed is:

1. Broadband underwater acoustic transducer, comprising:

at least one piezoelectric plate operating in flexion;

a baseboard having a first predetermined mode of resonance, said baseboard having a variable thickness; and a cylindrical cap closed at a first end by the baseboard and open at a second end to form a first cavity, said cap having a second predetermined mode of resonance different than said first predetermined mode of resonance, wherein the at least one piezoelectric plate is fixed on an outside face of the baseboard and the first cavity is open freely toward an outside medium in which the cap is immersed.

2. The transducer as claimed in claim 1, wherein a cross-section of the cap is circular.

3. The transducer as claimed in claim 1, wherein a cross-section of the cap is elliptical and said cap has a third predetermined mode of resonance.

4. The transducer as claimed in claim 1, wherein the first cavity is filled at least partially with a matching material having acoustic characteristics different from those of the outside medium in which the transducer is immersed.

5. The transducer as claimed in claim 1, further comprising a body including a second inside cavity closed by the cap to be insulated from the outside medium with the at least one piezoelectric plate enclosed in the second inside cavity and the first cavity pointing outward.

6. The transducer as claimed in claim 1, further comprising two cap/piezoelectric plate assemblies fixed together head-to-tail.

7. The transducer as claimed in claim 1, wherein the cap forms a front face of a tonpilz transducer.

8. The transducer as claimed in claim 1, wherein said baseboard has a central thickness greater than a peripheral thickness.

* * * * *